(12) United States Patent
Hunstig et al.

(10) Patent No.: US 10,960,488 B2
(45) Date of Patent: Mar. 30, 2021

(54) OPERATING METHOD FOR AN ULTRASONIC WIRE BONDER WITH ACTIVE AND PASSIVE VIBRATION DAMPING

(71) Applicant: Hesse GmbH, Paderborn (DE)

(72) Inventors: Matthias Hunstig, Paderborn (DE); Michael Broekelmann, Delbrueck (DE)

(73) Assignee: Hesse GmbH, Paderborn (DE)

( * ) Notice: Subject to any disclaimer, the term of this patent is extended or adjusted under 35 U.S.C. 154(b) by 91 days.

(21) Appl. No.: 15/776,485

(22) PCT Filed: Nov. 24, 2016

(86) PCT No.: PCT/DE2016/100546
§ 371 (c)(1),
(2) Date: May 16, 2018

(87) PCT Pub. No.: WO2017/092730
PCT Pub. Date: Jun. 8, 2017

(65) Prior Publication Data
US 2018/0369952 A1 Dec. 27, 2018

(30) Foreign Application Priority Data
Dec. 1, 2015 (DE) ...................... 10 2015 120 824.5

(51) Int. Cl.
*B23K 20/10* (2006.01)
*B23K 20/00* (2006.01)
(Continued)

(52) U.S. Cl.
CPC ............ *B23K 20/10* (2013.01); *B23K 20/004* (2013.01); *H01L 24/78* (2013.01); *H01L 24/85* (2013.01);
(Continued)

(58) Field of Classification Search
CPC .............. B23K 20/10–106; B23K 1/06; B23K 20/005; B23K 20/007; B23K 20/004;
(Continued)

(56) References Cited

U.S. PATENT DOCUMENTS 5,070,041 A * 12/1991 Katayama ............... H01L 21/50
29/827
5,078,312 A * 1/1992 Ohashi ................... B23K 20/10
228/1.1
(Continued)

FOREIGN PATENT DOCUMENTS

DE       10314499 A1    10/2004
DE    102010015379 A1    11/2010
(Continued)

OTHER PUBLICATIONS

Machine translation of DE102013012716A1 (no date available).*
(Continued)

*Primary Examiner* — Kiley S Stoner
(74) *Attorney, Agent, or Firm* — Patent Central LLC; Stephan A. Pendorf

(57) ABSTRACT

A method for operating an ultrasonic wire bonder. The ultrasonic wire bonder has a bonding head with a bonding tool and with a transducer for exciting ultrasonic vibrations in the bonding tool and a controller (2) for the transducer (1).
(Continued)

Figure 1:
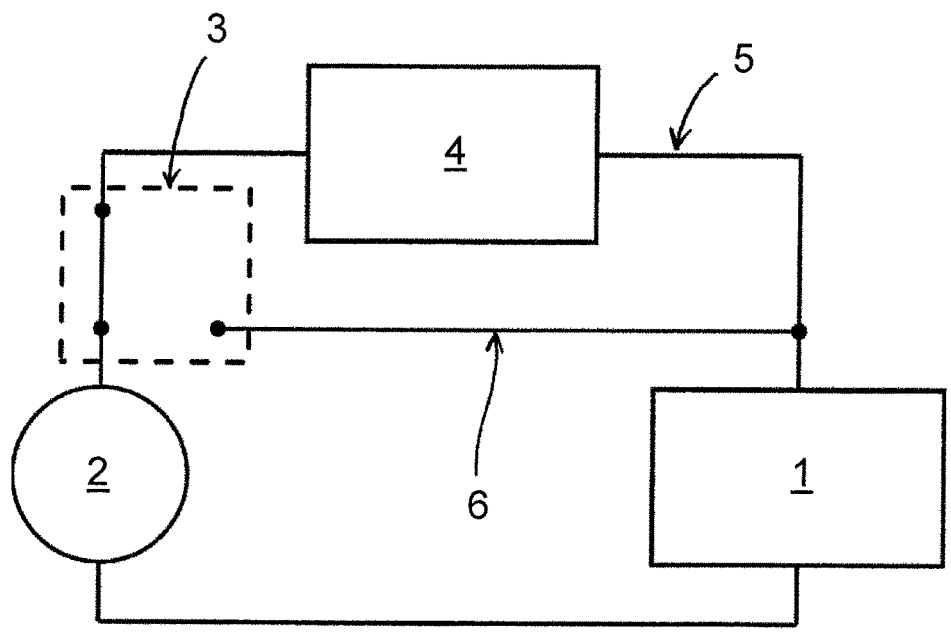

In a first process phase I a bonding wire is bonded to a substrate. The bonding wire is pressed against the substrate with a bonding force via a tool tip of the bonding tool, and the bonding tool is then excited so as to undergo ultrasonic vibrations in order to produce a bond between the bonding wire and the substrate, the transducer (1) being excited so as to vibrate for a specified or variable bonding time. In a second process phase II, the actuation of the transducer (1) is changed and reverberations of the bonding tool are counteracted, the transducer (1) being operated in a damped manner.

8 Claims, 7 Drawing Sheets

(51) Int. Cl.
*H01L 23/00* (2006.01)
*B23K 101/40* (2006.01)

(52) U.S. Cl.
CPC .. *B23K 2101/40* (2018.08); *H01L 2224/7592* (2013.01); *H01L 2224/75349* (2013.01); *H01L 2224/75901* (2013.01); *H01L 2224/859* (2013.01); *H01L 2224/85205* (2013.01); *H01L 2924/00014* (2013.01)

(58) Field of Classification Search
CPC ..... B23K 2101/40; H01L 24/85; H01L 24/78; H01L 2924/00014; H01L 2224/7592; H01L 2224/75901; H01L 2224/85205; H01L 2224/859; H01L 2224/75349
USPC ..................... 228/1.1, 110.1, 4.5, 180.5, 904
See application file for complete search history.

(56) References Cited

U.S. PATENT DOCUMENTS

| | | | | |
|---|---|---|---|---|
| 5,385,288 | A | * | 1/1995 | Kyomasu ............. B23K 20/106 228/1.1 |
| 5,667,130 | A | * | 9/1997 | Morita ................. B23K 20/005 228/110.1 |
| 2009/0127317 | A1 | * | 5/2009 | Siepe ................... B23K 20/004 228/110.1 |
| 2010/0127599 | A1 | * | 5/2010 | Thuerlemann ........... B06B 3/00 310/323.18 |
| 2011/0266329 | A1 | * | 11/2011 | Hesse ................. B23K 20/002 228/110.1 |
| 2011/0278682 | A1 | * | 11/2011 | Chiou ................... G01L 19/148 257/415 |

FOREIGN PATENT DOCUMENTS

| | | | |
|---|---|---|---|
| DE | 102013012716 A1 | 2/2015 | |
| JP | 06209032 A * | 7/1994 | ............. H01L 24/85 |
| JP | 07169798 A * | 7/1995 | ............. H01L 24/45 |

OTHER PUBLICATIONS

International Search Report dated Apr. 4, 2017, in International Application No. PCT/DE2016/100546.
Broekelmann, Michael "Active Vibration Control in Ultrasonic Wire Bonding—PowerGuru—Power Electronics Information Portal" Dec. 17, 2014 (Dec. 17, 2014), XP055356704 Retrieved from the Internet URL: http://www.powerguru.org/active-vibration-control-in-ultrasonic-wire-bonding/ (retrieved on Mar. 21, 2017), pp. 1-4, figure 1.
International Preliminary Report on Patentability (with English language translation) dated Jun. 14, 2018, in International Application No. PCT/DE2016/100546.

* cited by examiner

OPERATING METHOD FOR AN ULTRASONIC WIRE BONDER WITH ACTIVE AND PASSIVE VIBRATION DAMPING

The invention relates to a method for operating an ultrasonic wire bonder, wherein the ultrasonic wire bonder includes a bonding head with a bonding tool and a transducer for exciting ultrasonic vibrations in the bonding tool and a controller for the transducer, the method including a first process phase in which a bonding wire is bonded to a substrate, wherein the bonding wire is pressed by means of a tool tip of the bonding tool with a bonding force against the substrate and then, for producing a cohesive, electrically conductive connection between the bonding wire and the substrate, the bonding tool is excited to vibrate ultrasonically by the transducer for a predetermined or variable bonding time. An ultrasonic wedge-wedge bonder and a ball wedge bonder are ultrasonic wire bonders in the sense of the invention.

In order to produce an electrically conductive connection between a substrate and a bonding wire by means of an ultrasonic wire bonder, today an ultrasonic transducer excited by a controller to vibrate in the ultrasonic range. The vibrations are transmitted to a bonding tool connected to the transducer so that the bonding tool is in turn excited to vibrate. By way of example, the geometry of the bonding tool and of the transducer is designed in such a way that the bonding tool performs bending oscillations and a vibration amplitude in the region of a tool tip of the bonding tool applied to the bonding wire during the bonding process is caused to be sufficiently large. Therein after a particular process time (bond time), when applying a sufficiently high bond force or at a sufficient wire deformation, a cohesive connection between the bonding wire and the substrate is made. After the production of the material connection, the ultrasonic friction is turned off. Subsequently there is then for example, a predefined waiting time in which the vibration of the bonding tool subsides and/or the bonding head is raised. The waiting time is in this case typically greater than or equal to the decay time of the vibration of the bonding tool. Following the waiting period, the bonding head is repositioned to carry out the next bond. The characteristic process parameters, in particular the bond force, the wire deformation or the speed of the tool tip of the bonding tool are not recorded during the waiting time or during the vibration decay time.

The object of the present invention is to develop an operating method for an ultrasonic wire bonder in such a way that the quality of the bond connection is improved or the cycle time is reduced.

To solve the task the invention is characterized, in conjunction with the preamble of claim 1, in that in a subsequent second process phase the control of the transducer is changed and counteracts post-vibrations of the bonding tool, in that the transducer is operated in an attenuating manner.

The particular advantage of the invention is that by the attenuation of the transducer, the bonding quality increases and in particular a reduction of the variationing is achieved with respect to the essential bonding process parameters used in the assessment of the quality of the bonding. In addition, in the second process phase, the decay time can be reduced and the cycle time can be reduced. It has been achieved by the ultrasonic wire bonding method according to the invention to realize more bonds per unit time and to significantly improve the efficiency of the connection process. In particular, it has been found that the decay time for the bonding tool could be reduced by more than 75% depending on the process.

According to the invention, by a change in the driving of the transducer, there is understood either a change in the excitation, that is, in particular, the impressing a modified ultrasound voltage, or influencing or modifying the circuitry serving as controller for driving of the transducer. In contrast to the understanding of the invention, a change in the control of the transducer is not caused when the ultrasound voltage or the excitation of the transducer is switched off and in particular the control circuitry remains unchanged. An attenuation or damping of the transducer can take place actively or passively in the sense of the invention. In passive damping, vibration energy is dissipated. For example, dissipative acting components are connected in series to the transducer. The active damping of the transducer takes place, for example, by the control-side impressing of a reverse voltage.

According to a preferred embodiment of the invention, at least individual bonding process parameters important for assessing the bond quality are determined and processed during the second process phase. In particular, the bonding force or a deformation of the bonding wire or with additional sensors the mechanical oscillation amplitude of the bonding tool or a transducer current are respectively detected. The acquisition of the bonding process parameters can be model-based, likewise the bonding process parameters can be measured directly or calculated from measured or model-based determined parameters. Advantageously, by determining the bonding process parameters, a higher consistency or uniformity of the bonds can be detected or monitored, since the bonding tool does not freely post-resonate and/or the countervoltage is switched off in time during active damping. In addition, it becomes possible to select a transition point for the change in the control of the transducer, having knowledge of the bonding process parameters expected in the second process phase. Applicant's experiments have shown that, in particular with thin bonding wires and short bonding times, a smaller variation with respect to the bonds is achieved. The variation of the bonds is thereby subsequently assessed on the basis of geometric measurement values (for example, bond footprint) or connection parameters (for example, pull force, i.e. the force with which it is necessary to pull on the wire in order for the bond or wire to be damaged).

According to a development of the invention, the transition time for the change from the first process phase to the second process phase can be determined by determining at least one bonding process parameter from the group of bonding process parameters and comparing it with a stored desired value. The transition time can thus be determined individually or the duration of the first process phase can be selected variably. Depending on the bonding process parameters, this further achieves a further reduction in the variation of the bonds or an improvement in bond quality.

According to a preferred embodiment of the invention, the transducer can be passively attenuated in the second process phase. For this purpose, at least one electrical component dissipating the oscillation energy is connected in series with the transducer. As an electrical component there may be considered in particular an ohmic resistance (resistive damping) or a resistance and an inductance (resonant damping). Advantageously, by the passive damping the uncontrolled post-vibration can very effectively be counteracted and the decay time can be reduced. In particular, a resistance value for the resistance or an inductance value for the inductance is selected such that the decay time is reduced. An optimum resistance value for the resistor or an optimal inductance value can be determined numerically, for example, using a modal model of the ultrasound system. For this purpose, the decay time of the ultrasound system is calculated together with the connected components. The components are then chosen so that the decay time is as low as possible.

According to a preferred embodiment of the invention, the transducer can be operated actively damped in the second process phase. For this purpose, a reverse or counter-voltage is applied to the transducer in such a way that the transducer current is provided out of phase with the counter-voltage. The counter-voltage is hereby applied in particular only as long as the bonding tool post-vibrates. Advantageously, by the active damping of the transducer, a similar strong vibration reduction can be achieved as in the resistive or resonant circuit. In addition, the variability in terms of damping is particularly large. A phase offset between the transducer current and the counter voltage in the range of 180°+/−60° is advantageous. In particular, a phase shift in the range of 180°+/−10° is desirable and a phase shift of 180° is optimal.

According to the invention, the attenuation of the transducer may be passive or active. Likewise, a passive and active damping of the transducer can be provided according to the invention at the same time.

From the other dependent claims and the following description further advantages, features and details of the invention can be seen. There mentioned features may be essential to the invention individually or in any combination. The drawings are merely illustrative of the example of the invention and are not of a restrictive nature.

Figure 2:
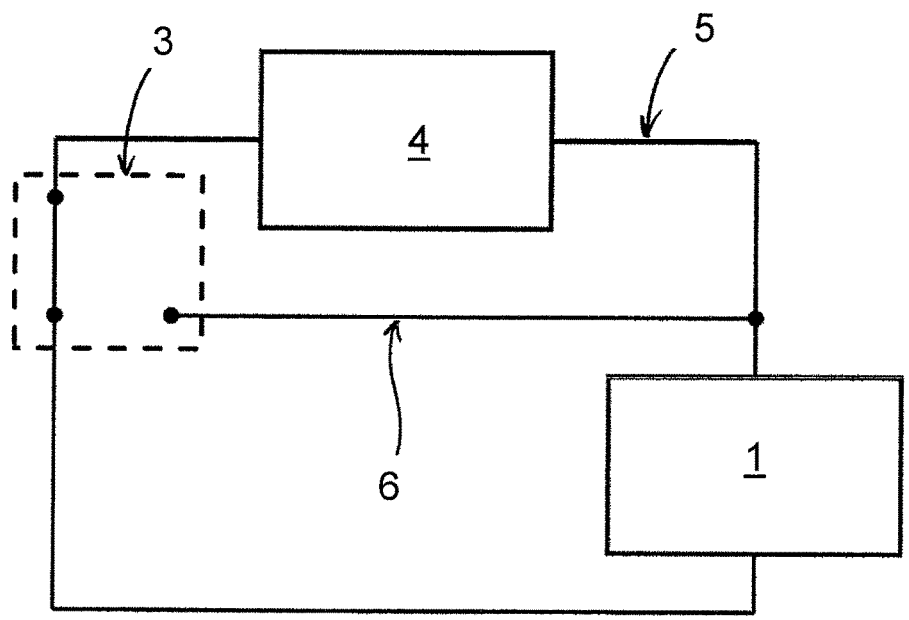
Figure 3:
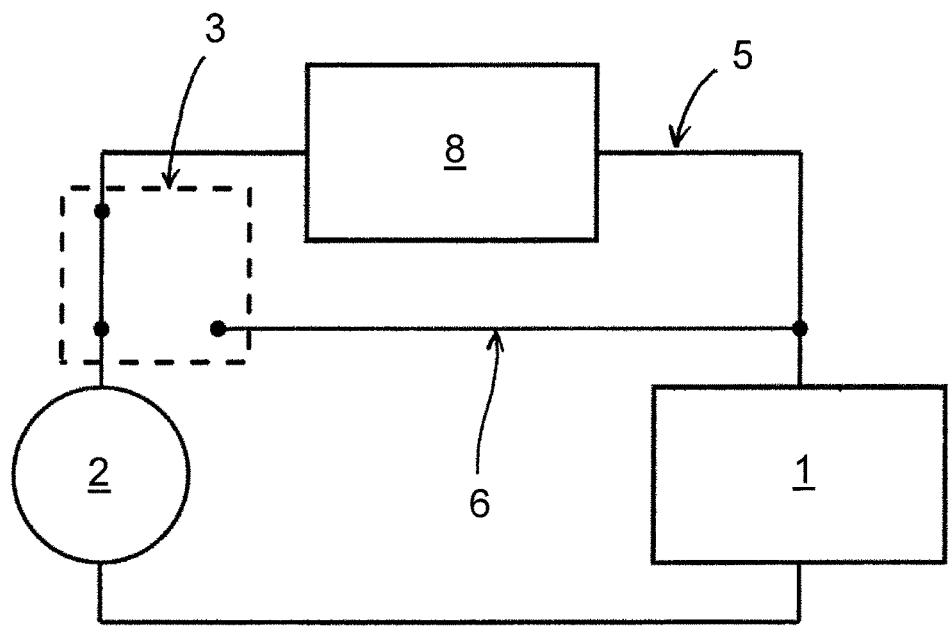
Figure 4:
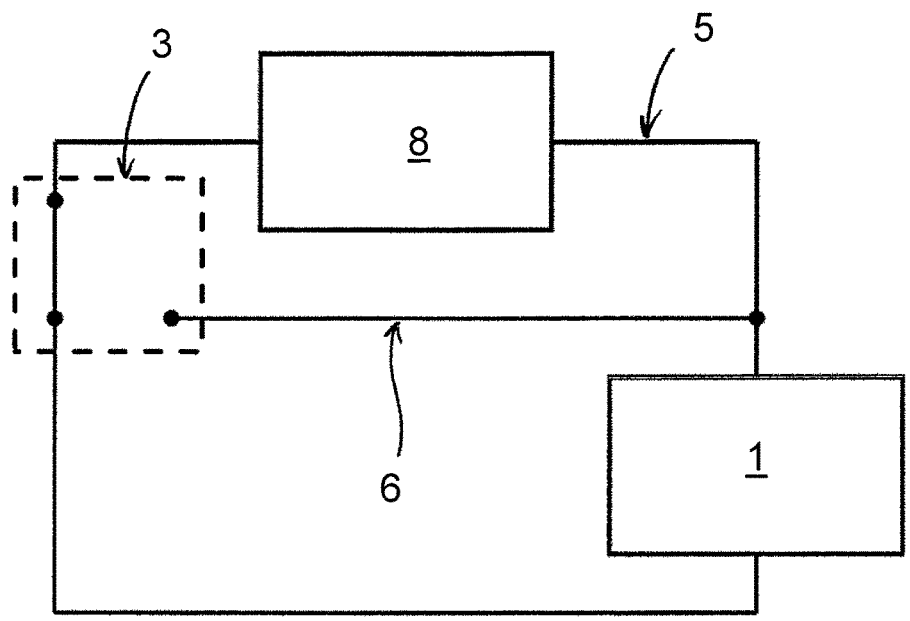
Figure 5:
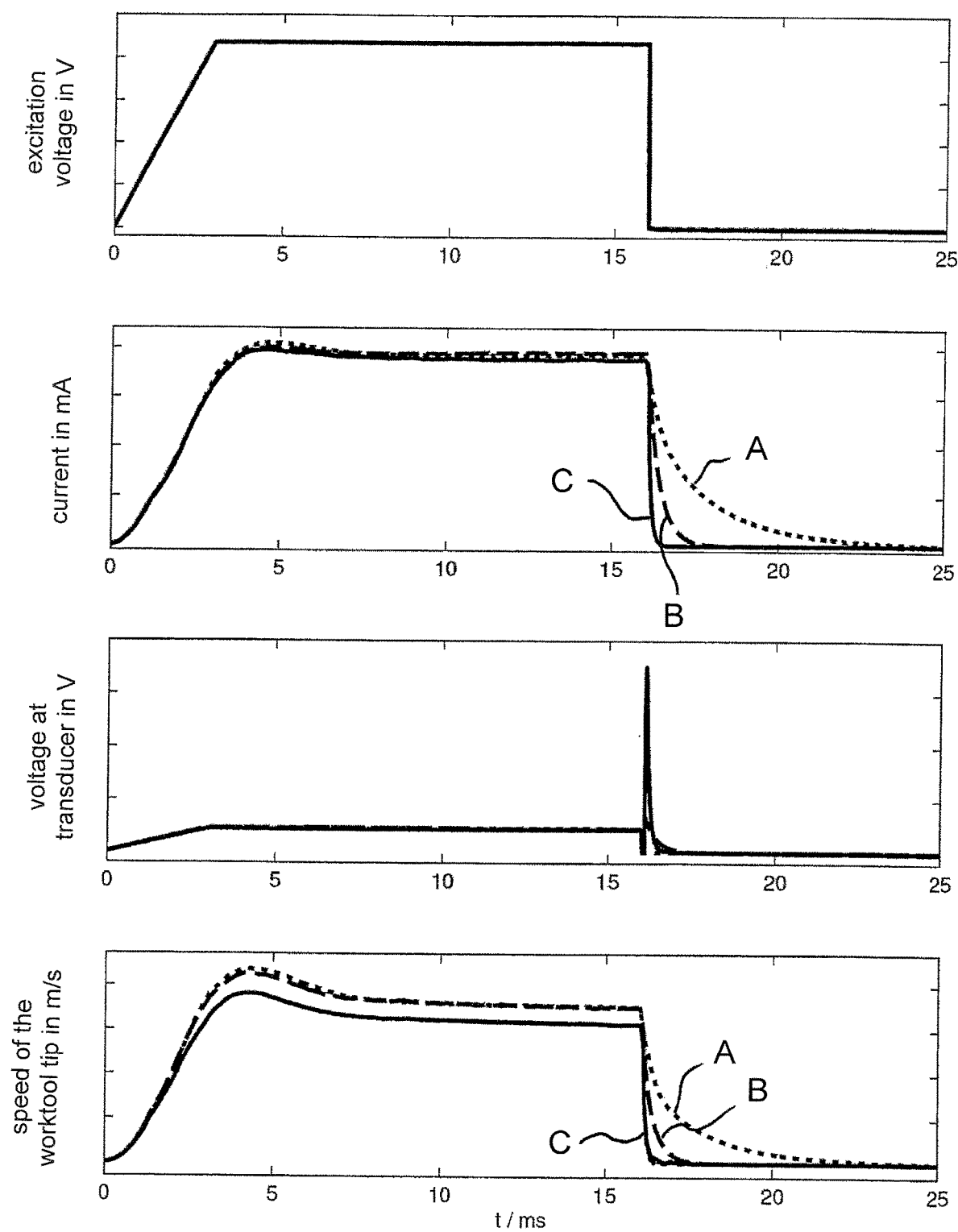
Figure 6:
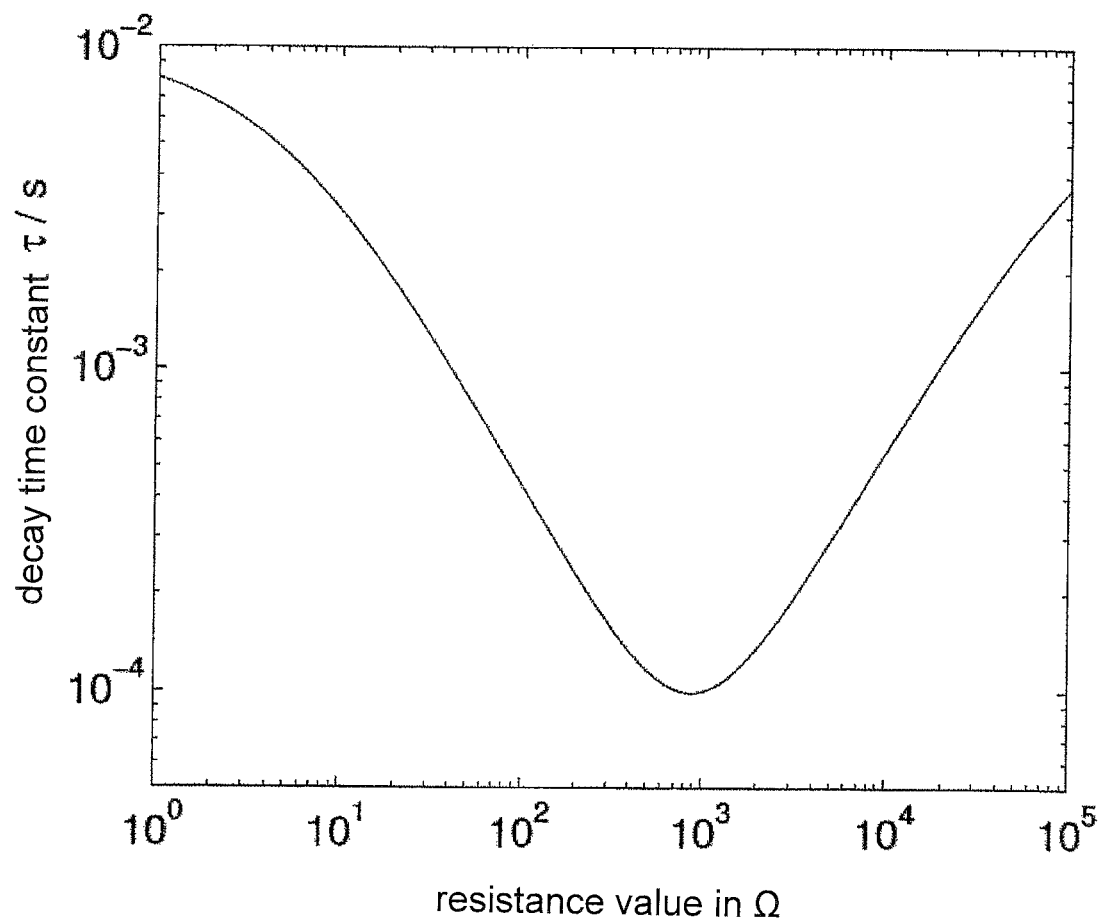
Figure 7:
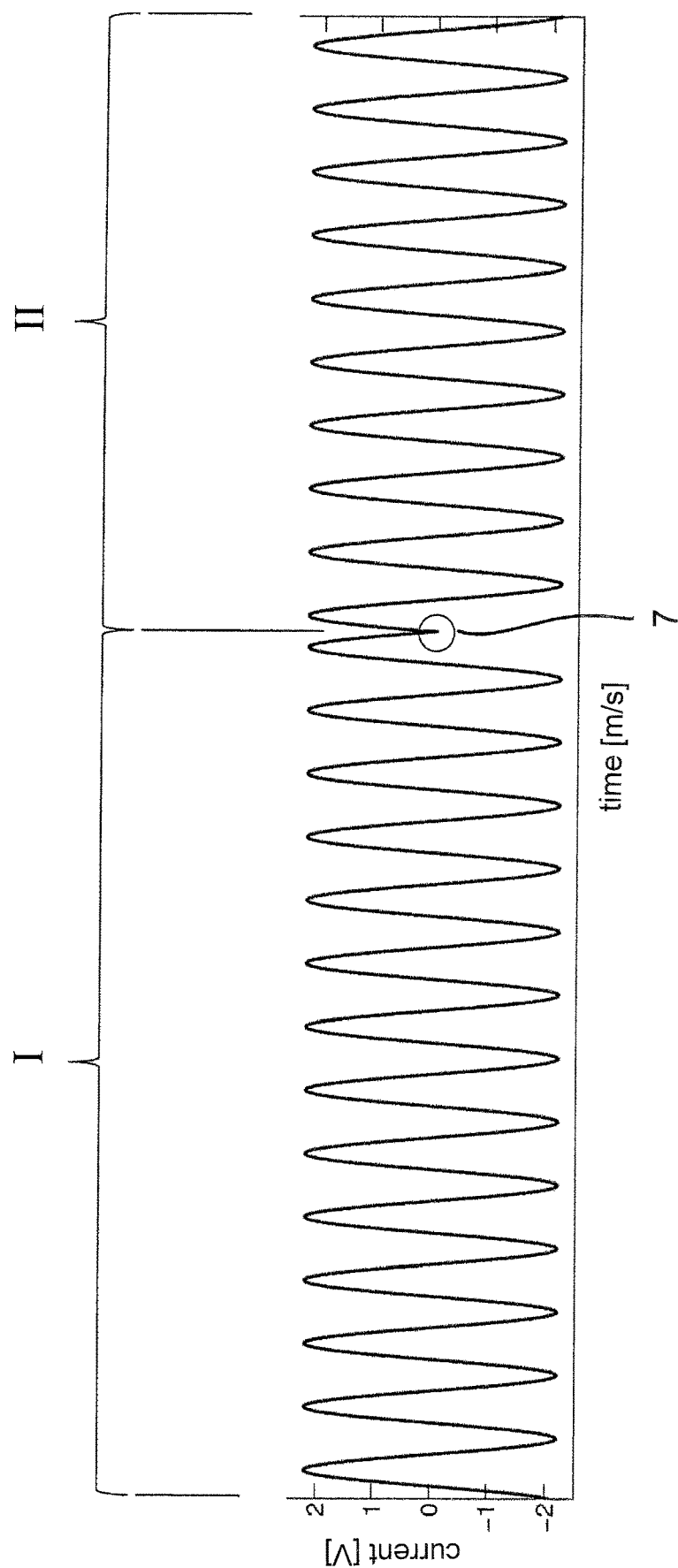
Figure 8:
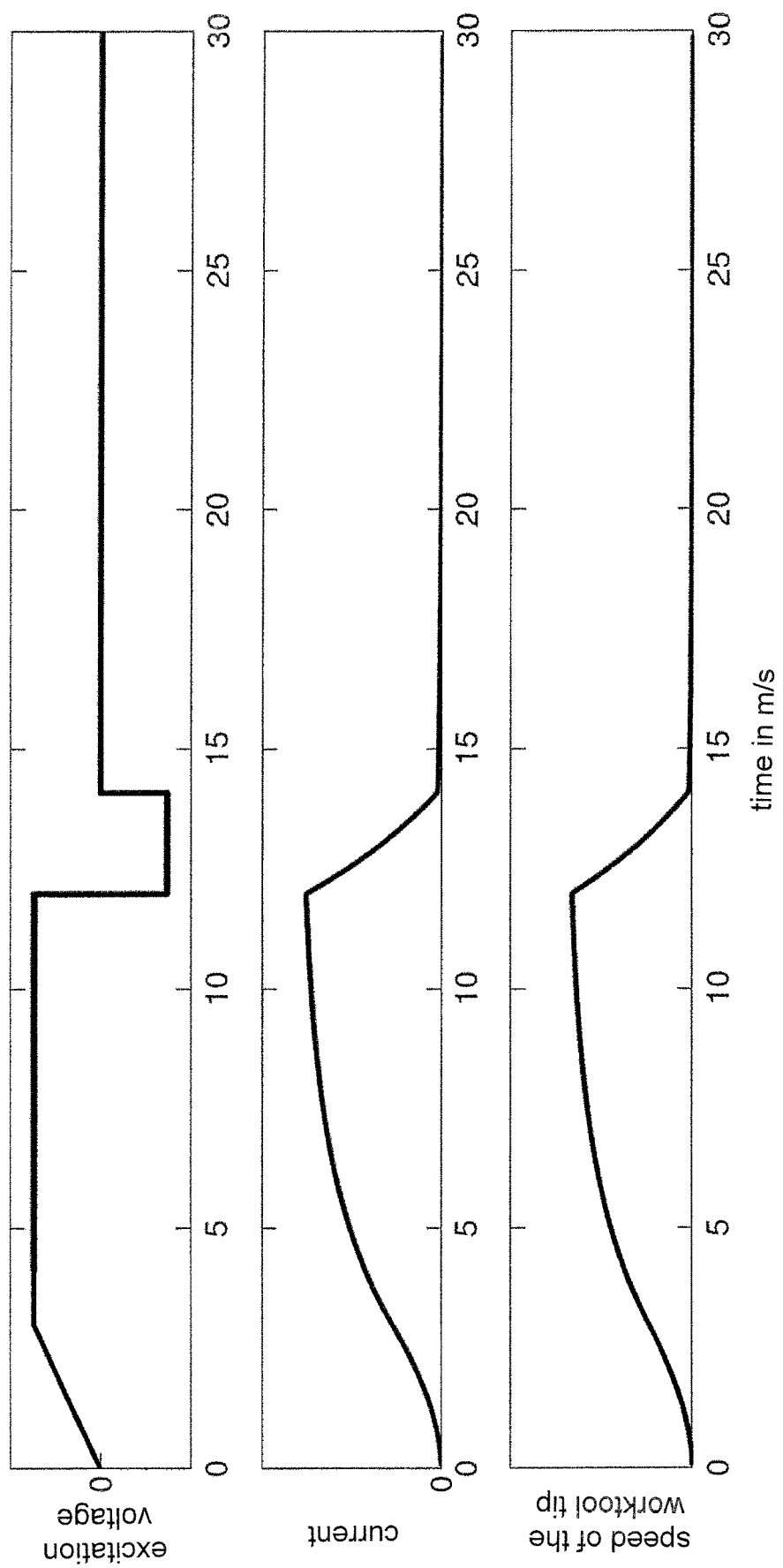
Figure 9:
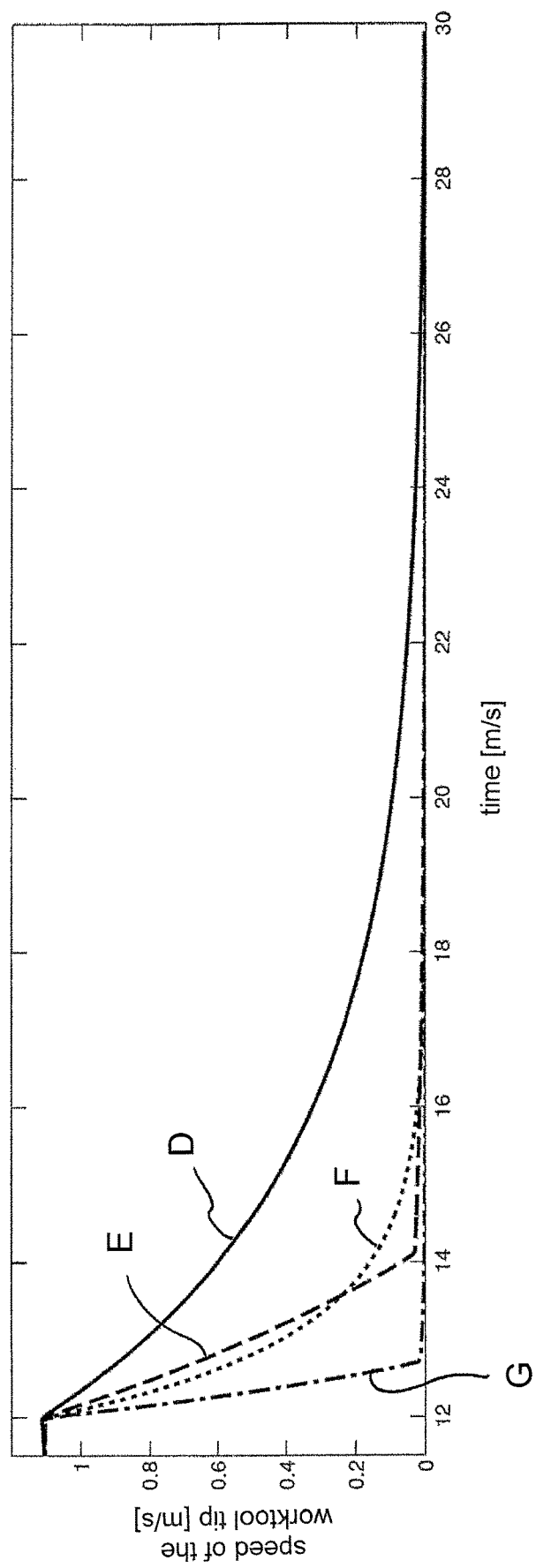

There is shown in:

FIG. 1 a first embodiment of a circuit arrangement for passive attenuating a transducer in a first circuit state (first process phase), FIG. 2 the circuit arrangement according to FIG. 1 in a second circuit state (second process phase), FIG. 3 a second embodiment of the circuit arrangement for the passive damping of the transducer in the first circuit state (first process phase), FIG. 4 the circuit arrangement according to FIG. 3 in the second circuit state (second process phase), FIG. 5 a plot of the excitation voltage, the transducer current (current), the transducer voltage, and the speed of the tool tip versus time;

FIG. 6 an exemplary representation of the decay time constant τ over the resistance value for the resistor for an exemplary selected transducer, FIG. 7 a schematic representation of the voltage reversal for actively attenuating the vibration of the transducer, FIG. 8 a representation of the excitation voltage, the transducer current and the speed of the tool tip in the actively damped transducer and FIG. 9 a reverberation time comparison for the unattenuated transducer, for the actively attenuated transducer, for the passively attenuated transducer, and for the simultaneously active and passive attenuated transducer.

An ultrasonic bonder designed for carrying out the bonding method according to the invention includes as essential to the invention a movably held bond head with a transducer 1 and a bonding tool secured on the transducer 1 and a controller 2 for providing an excitation voltage for the transducer 1. The controller 2 is particularly adapted to predetermine the drive or excitation voltage, so that a suitable transducer voltage is provided for carrying out the implementation of the bonding method. The controller 2 includes, in particular a voltage source for supplying the drive voltage. Ignoring at least approximately the influence of the electrical lines, the drive voltage corresponds to the transducer voltage.

A bonded, electrically conductive connection between a bonding wire and a substrate is produced in a first process phase I, by pressing the bonding wire against a substrate with a defined constant or variable bond force by means of a tool tip of the bonding tool and then exiting the bonding tool into ultrasonic vibrations, by exciting the transducer for a predetermined or variable time interval (bonding time) to ultrasonic vibrations. In this case, it may be provided that during the first process phase I at least individual bonding process parameters essential for the assessment of a quality of the bond are monitored or measured. In particular, the bonding time, deformation of the bonding wire, the bonding force, mechanical oscillation amplitude of the bonding tool detected with help of additional sensors, the transducer current or the transducer voltage and the excitation voltage can be are monitored or be determined or calculated with model-based or measurement technical facilities.

In order to reduce reverberation of the bonding tool after the end of the first subprocess I, the transducer 1 can be passively attenuated in a second process phase II. A first embodiment of a suitable circuit arrangement for the passive damping of the transducer 1 is shown in FIGS. 1 and 2. In particular, it is provided that the control of the transducer 1 is changed in order to realize the passive damping. According to the invention, it is provided that the transducer 1 is connected to the controller 2 via two parallel conductors 5, 6. A first conductor is designed in the manner of a resistance conductor 5. In the resistor conductor 5, an ohmic resistor 4 is provided. Parallel to the resistance conductor 5, a parallel conductor 6 is provided, which dispenses with a resistor. In addition, a switching element 3 is assigned to the parallel conductors 5, 6. The switching element 3 is designed so that in a first switching state, the controller 2 is connected to the transducer 1 via the parallel conductor 6. In a second switching state of the switching element 3, the connection of the transducer 1 to the controller 2 takes place via the resistance conductor 5.

The ultrasonic wire bonding method according to the invention provides that during the first phase of the process I, the switching element 3 is provided in the first switching state and the transducer 1 is connected via the parallel conductor 6 with the controller 2. After establishing the cohesive, electrically conductive connection between the bonding wire and the substrate, the control for the transducer 1 is changed, in that the switching element 3 is moved to the second switching state. The transducer 1 is then connected to the controller 2 via the resistor conductor 5. The resistive wiring of the transducer 1 is provided so far only during the second process phase II.

In the second process phase II, the vibration energy during decay is not dissipated for the most part in the transducer 1, the friction contacts and the bond, but rather in the resistor 4. The resistor 4 can be provided remotely from the transducer 1 or the controller 2. By the dissipation of the vibrational energy in the resistor 4, the decay time shortens or the post reverberation of the bonding tool is effectively counteracted.

According to a variant of the first embodiment of the inventive circuit arrangement, in addition to the resistor 4, an inductance can be provided in the resistor conductor 5. The resistor 4 and the inductance then form an electrical network which is associated with the resistor conductor 5.

Inductance value and resistance value can then be chosen so that the decay time constant is minimized.

According to a second embodiment of the inventive circuit arrangement according to FIGS. 3 and 4, the resistor conductor 5 is now associated with an electrical network 8, which by way of example includes a not individually shown resistor and inductor (also not shown), and permanently connects the transducer 1 with the controller 2. Parallel to the resistor conductor, the parallel conductor 6 is provided for connecting the controller 2 to the transducer 1. The parallel conductor 6 alone is functionally associated with the switching element 3, so that selectively the connection of the controller 2 to the transducer 1 is established or interrupted via the bypass line 6.

While the resistor conductor 5 is substantially without function in the first switching state according to FIG. 3 and the transducer is operated without attenuation (first process stage I), by the interruption of the parallel conductor 6 in the second phase II of the process (FIG. 4) the transducer 1 is attenuated via the electrical network 8.

Instead of the electrical network 8, according to a variant of the circuit arrangement of the second embodiment, as shown in the examples according to FIGS. 1 and 2, the resistor conductor 5 can be assigned only a single resistor 4. Likewise, the electrical network 8 may provide other or further electrical components. What is essential is that the electrical network 8 provides a damping effect with respect to the transducer 4.

In the diagram according to FIG. 5 the amplitudes of the excitation voltage, which is provided by the controller 2, the transducer current, the transducer voltage and speed of the tool tip are represented over time. It can be seen in particular that when the excitation voltage is switched off in the absence of the resistor 4 (curve A), a decay time of about 8 ms will have to be considered. For a first resistance value (curve B), the decay time is reduced by about 75% to about 2 ms. At a second resistance value (curve C) for the resistor 4, the decay time further is further reduced by more than 90% to less than 1 ms. In this case, the resistance of the resistor 4 is chosen to be greater for the curve C than for the curve B. A very similar course is also to be recognized in relation to the speed of the tool tip. Here, the speed of the tool tip when providing the first resistance value (curve B) compared to the speed in the unattenuated case (curve A) is significantly reduced. Further reduction is achieved in case of providing a second resistance value (curve C).

A measure of the reduction of the decay time is in particular the resistance value. In this case, an optimum resistance value for the damping of the transducer 1 can be determined. FIG. 6 shows in principle how a resistance value for the resistor 4 is optimally determined. In particular, the determination is made numerically by means of a modal model of the ultrasound system such that a decay time constant is set as small as possible. Alternatively, a suitable resistance value can be experimentally determined, for example, by measuring the decay time constant of the system with different resistances and choosing a resistance value which achieves the lowest possible decay time constant.

The decay time constant r describes the time after which the amplitude of vibration of 1 has fallen to 1/e, i.e., to 36.79%. After 3τ, the oscillation amplitude has dropped to $1/e^3$ (4.96%). After 5τ, the oscillation amplitude is reduced to 0.67%. If the decay time is defined so that after this time less than 1% of the original amplitude is present, this can be determined to be for example 4.7τ.

According to a further embodiment of the invention, the damping of the transducer 1 can take place actively. For this purpose, a reverse voltage is impressed on the transducer 1 in the second process phase II. FIG. 7 shows by way of example how the voltage is inverted at a transition time point 7 between the first process phase I and the second process phase II. In particular, in order to optimally damp the transducer 1, a phase offset between the transducer current and the counter-voltage is provided in the range of 180°.

FIG. 8 shows, in the case of the active damping of the transducer 1, the time course of the amplitude of the excitation voltage, the transducer current and the speed of the tool tip. A negative amplitude describes a phase offset of 180° with respect to a positive amplitude. It can be seen in particular that the counter voltage is present only until the transient oscillation dies down and is subsequently changed to zero. During the decay of the oscillation, the transducer current and the speed of the tool tip are accordingly significantly reduced.

FIG. 9 shows a comparison of the amplitude of the speed of the tool tip in the event that the transducer 1 is not operated damped (curve D), that the transducer 1 is operated actively damped (curve E), that the transducer is operated passively damped 1 (curve F) and that the transducer 1 is simultaneously actively and passively attenuated (curve G). It can be seen that the active and the passive damping (curves E and F) reduce the decay time for the transducer 1 very significantly and that further optimization is achieved in particular in the simultaneous active and passive damping (curve G) of the transducer 1.

Identical components and component functions are identified by the same reference numerals.

The invention claimed is:

1. A method of operating an ultrasonic wire bonder, wherein the ultrasonic wire bonder includes a bonding head with a bonding tool and a transducer (1) for exciting ultrasonic oscillations in the bonding tool and a controller (2) for the transducer (1), the method comprising
    in a first process phase I, bonding a wire to a substrate by pressing the bonding wire by means of a tool tip of the bonding tool with a bond force against the substrate and then, to produce a cohesive connection between the bonding wire and the substrate, exciting the bonding tool to ultrasonic vibrations, wherein the transducer (1) is excited to vibrate for a predetermined or variable bonding time, and
    in a subsequent second process phase II, operating the transducer (1) passively damped by at least one vibration energy dissipating electrical component connected in series to the transducer (1), and switching off the excitation of the transducer (1).

2. The method according to claim 1, wherein during the second process phase II, the bonding force and/or deformation of the bonding wire and/or a velocity of the tool tip of the bonding tool and/or with help of an additional sensor mechanical oscillation amplitude of the bonding tool is detected and/or a transducer current and/or a transducer voltage are determined and/or processed.

3. The method according to claim 1, wherein as the electrical component, an ohmic resistor (4) is connected in series to the transducer (1).

4. The method according to claim 1, wherein as an electrical component the ohmic resistor (4) and an inductor are connected in series to the transducer (1).

5. The method according to claim 3, wherein a resistance value for the resistor (4) and/or an inductance value for the inductor are determined such that a decay time for the bonding tool is reduced.

6. A method of operating an ultrasonic wire bonder, wherein the ultrasonic wire bonder includes a bonding head with a bonding tool and a transducer (1) for exciting ultrasonic oscillations in the bonding tool and a controller (2) for the transducer (1), the method comprising in a first process phase I bonding a wire to a substrate by pressing the bonding wire by means of a tool tip of the bonding tool with a bond force against the substrate and then, to produce a cohesive connection between the bonding wire and the substrate, exciting the bonding tool to ultrasonic vibrations, wherein the transducer (1) is excited to vibrate for a predetermined or variable bonding time, and in a second process phase II operating the transducer actively damped by a counter voltage applied to the transducer 1, wherein the counter voltage is provided phase offset to transducer, wherein a phase offset of transducer voltage and counter voltage is in the range of 180°+/−60°.

7. The method of claim 6, wherein the counter voltage is applied only as long as the bonding tool continues to resonate.

8. The method according to claim 1, wherein a transition time point (7) for the change from the first process phase I to the second process phase II is determined by at least one bonding process parameter from the group bonding time, deformation of the bonding wire, bonding force, speed of the tool tip of the bonding tool, transducer current and/or mechanical oscillation amplitude of the bonding tool detected with help of an additional sensor and/or transducer voltage determined during the first process stage I and compared with a stored desired value.

* * * * *